United States Patent
Chu et al.

[11] Patent Number: 6,063,548
[45] Date of Patent: May 16, 2000

[54] METHOD FOR MAKING DRAM USING A SINGLE PHOTORESIST MASKING STEP FOR MAKING CAPACITORS WITH NODE CONTACTS

[75] Inventors: Wen-Ting Chu, Kaoushing County; Chung-Cheng Wu, I-Lan, both of Taiwan

[73] Assignee: Taiwan Semiconductor Manufacturing Company, Hsin-Chu, Taiwan

[21] Appl. No.: 09/148,565

[22] Filed: Sep. 4, 1998

[51] Int. Cl.[7] ................................................ G03C 5/00
[52] U.S. Cl. ........................ 430/314; 430/316; 430/317; 430/319; 438/253; 438/254; 438/381; 438/396; 438/397
[58] Field of Search ..................... 430/314, 316, 430/317, 319; 438/253, 254, 381, 396, 397

[56] References Cited

U.S. PATENT DOCUMENTS

| | | | |
|---|---|---|---|
| 5,453,633 | 9/1995 | Yum | 257/306 |
| 5,580,811 | 12/1996 | Kim | 437/52 |
| 5,604,146 | 2/1997 | Tseng | 437/52 |
| 5,677,223 | 10/1997 | Tseng | 437/52 |
| 5,705,438 | 1/1998 | Tseng | 438/238 |
| 5,712,202 | 1/1998 | Liaw et al. | 438/253 |
| 5,728,618 | 3/1998 | Tseng | 438/253 |
| 5,733,808 | 3/1998 | Tseng | 438/239 |

*Primary Examiner*—Christopher G. Young
*Attorney, Agent, or Firm*—George O. Saile; Stephen B. Ackerman

[57] ABSTRACT

A method for forming stacked capacitors for DRAMs using a single photoresist mask and having bottom electrodes self-aligned to node contacts is achieved. A planar silicon oxide ($SiO_2$) first insulating layer is formed over device areas. A first silicon nitride ($Si_3N_4$) hard mask layer is deposited and a second insulating layer is deposited. First openings are etched, partially into the first insulating layer, for the capacitor bottom electrodes. A second $Si_3N_4$ layer is deposited and etched back to form sidewall spacers in the first openings. The $Si_3N_4$ hard mask and spacers are used to etch second openings (node contacts) in the first insulating layer, self-aligned in the first openings and to the source/drain contact areas. A first polysilicon layer is deposited and etched back to form recessed polysilicon plugs in the first openings. A third $Si_3N_4$ layer is deposited and etched back to form sidewall spacers on the plugs in the first openings and is used as a mask to etch the polysilicon to form the vertical sidewalls of the bottom electrodes self-aligned to the node contacts. The first insulating layer is recessed to expose the bottom electrodes. An interelectrode dielectric layer is formed on the bottom electrodes, and a patterned second polysilicon layer is used for the top electrodes.

20 Claims, 4 Drawing Sheets

METHOD FOR MAKING DRAM USING A SINGLE PHOTORESIST MASKING STEP FOR MAKING CAPACITORS WITH NODE CONTACTS

BACKGROUND OF THE INVENTION

(1) Field of the Invention

The present invention relates to the fabrication of dynamic random access memory (DRAM) devices, and more particularly to a method for fabricating cylindrical stacked capacitors with node contacts for DRAM cells using a single photoresist masking step.

(2) Description of the Prior Art

These DRAM circuits are used extensively in the electronics industry, and particularly in the computer industry for electrical data storage. The DRAM circuits consist of an array of individual memory cells, each cell consisting of an access transistor, usually a field effect transistor (FET), and a single storage capacitor. Information is stored on the cell as charge on the capacitor, which represents a unit of data (bit), and is accessed by read/write circuits on the periphery of the chip.

One conventional method to achieve a high density of memory cells on a DRAM chip is to form a capacitor node contact to one of the source/drain areas of the FET in each of the memory cells, and then to form a bottom electrode aligned over the node contact. In the next generation of semiconductor technology, the minimum feature sizes will be 0.25 micrometers or less. At these feature sizes, misalignment of the bottom electrode to the node contact can result in processing and reliability problems. Therefore it is desirable to make a DRAM device having the capacitor bottom electrode self-aligned to the node contact. In recent years the cost of DRAM devices has dramatically decreased, and therefore there is a strong need to also provide a more cost-effective manufacturing process in which the number of processing steps is minimized.

Numerous methods of making DRAM circuits with stacked capacitors are reported in the literature. Several methods for making DRAM capacitors are cited below. However, the methods require aligning the bottom electrode to the node contact and/or require additional masking steps. Alternatively, other methods form the capacitor adjacent to the bit line and therefore require additional area for memory cells. For example, in U.S. Pat. No. 5,677,223 and U.S. Pat. No. 5,728,618 to Tseng, the capacitor is not self-aligned to the node contact, in U.S. Pat. No. 5,712,202 to Liaw the bottom electrode is not self-aligned to the node contact. In U.S. Pat. No. 5,733,808 to Tseng, additional masking steps are required for making the node contact and the bottom electrode. U.S. Pat. No. 5,604,146 to Tseng, the capacitor bottom electrode is not self-aligned to the node contact. Kin in U.S. Pat. No. 5,580,811 forms the capacitor adjacent to the bit line and therefore requires additional cell area on the chip. Tseng in U.S. Pat. No. 5,705,438 forms the bit line adjacent to and in the same plane as the capacitor, and therefore requires additional cell area on the chip. In U.S. Pat. No. 5,453,633 to Yun, the bottom electrode is not self-aligned to the node contact and additional masking steps are required.

Therefore, there is still a need to form stacked capacitors in which the capacitor bottom electrode is self-aligned to the capacitor node contact using a single photoresist mask.

SUMMARY OF THE INVENTION

It is a principal object of the present invention to provide a method for making memory cells on DRAM devices having cylindrical stacked capacitors having increased capacitance.

Another object of this invention is to provide a method that utilizes a single photoresist masking step for fabricating the capacitor bottom electrodes self-aligned to the node contacts with deep sub-micron dimensions.

The invention begins by providing a semiconductor substrate (wafer) composed of single crystalline silicon. The details for the semiconductor devices in the substrate are only briefly described since they are not essential to understanding the invention. But typically the memory cells on a substrate for DRAM circuits have device areas surrounded and electrically isolated by field oxide (FOX) regions and semiconductor devices such as field effect transistors (FETs) in the device areas. A cylinder-shaped storage capacitor and having a capacitor node contact is then formed over each of the memory cell areas using a single photoresist masking step.

Continuing with the process, the method for making these cylinder-shaped capacitors using this single photoresist mask is achieved by depositing and planarizing a first insulating layer on the substrate. The first insulating layer is silicon oxide ($SiO_2$). A first silicon nitride ($Si_3N_4$) layer is deposited on the planar first insulating layer, and a second insulating layer is deposited on the first $Si_3N_4$ layer. First openings for capacitors are etched in the second insulating layer, the first $Si_3N_4$ layer, and partially into the first insulating layer aligned over the source/drain contact areas for the capacitor node contacts. A conformal second $Si_3N_4$ layer is deposited and anisotropically etching back to the second insulating layer to form first silicon nitride sidewall spacers in the first openings. Second openings are etched in the first insulating layer exposed in the first openings, using the sidewall spacers and the first $Si_3N_4$ layer as an etch mask to form self-aligned node contact openings to the source/drain contact areas. The first $Si_3N_4$ layer and the first $Si_3N_4$ sidewall spacers are removed, for example by etching in a hot phosphoric acid ($H_3PO_4$). An $N^+$ doped first polysilicon layer is deposited sufficiently thick to fill the first and second openings, resulting in an essentially planar surface. The first polysilicon layer is then etched back to form polysilicon plugs in the first and second openings and is overetched to recess the polysilicon plugs in the second openings. A conformal third $Si_3N_4$ layer is deposited and anisotropically etched back to form second $Si_3N_4$ sidewall spacers in the second openings over the recessed polysilicon plugs. The second $Si_3N_4$ sidewall spacers are used as an etch mask to etch and thereby recess the first polysilicon layer exposed in the second openings.

This results in forming vertical sidewalls for bottom electrodes of the cylindrical stacked capacitors. The second $Si_3N_4$ sidewall spacers are removed, also by using a hot $H_3PO_4$ acid etch. The first insulating layer is then partially etched back, for example by plasma etching, to form free-standing bottom electrodes aligned over the node contacts to the source/drain contact areas. The capacitors are now completed by forming an interelectrode dielectric layer on the bottom electrodes, and depositing and patterning a conductively doped second polysilicon layer to form the capacitor top electrodes.

BRIEF DESCRIPTION OF THE DRAWINGS

The objects and other advantages of this invention are best understood in the preferred embodiment with reference to the attached drawings, which are now briefly described.

DESCRIPTION OF THE PREFERRED EMBODIMENT

Now in keeping with the objects of the present invention, the method for forming the cylinder-shaped storage capacitors is covered in detail. These improved capacitors can be used on DRAM circuits having FET structures that are currently utilized in the manufacture of DRAMs. Therefore, only those details of the underlying substrate structure are described that are necessary for understanding the current invention for making these improved capacitors. It should also be well understood by those skilled in the art that by including additional processing steps, other types of devices can also be included on the DRAM chip. For example, by providing N and P doped wells, both P-channel and N-channel FETs can be formed for fabricating CMOS circuits, as are commonly used in the peripheral circuits of the chip. Although the method is described for node contacts that are not self-aligned, the method is applicable to making self-aligned contacts to increase cell density, for example, by including a few additional steps, such as a $Si_3N_4$ cap insulator and $Si_3N_4$ sidewall spacers on the FET gate electrodes.

Figure 1:
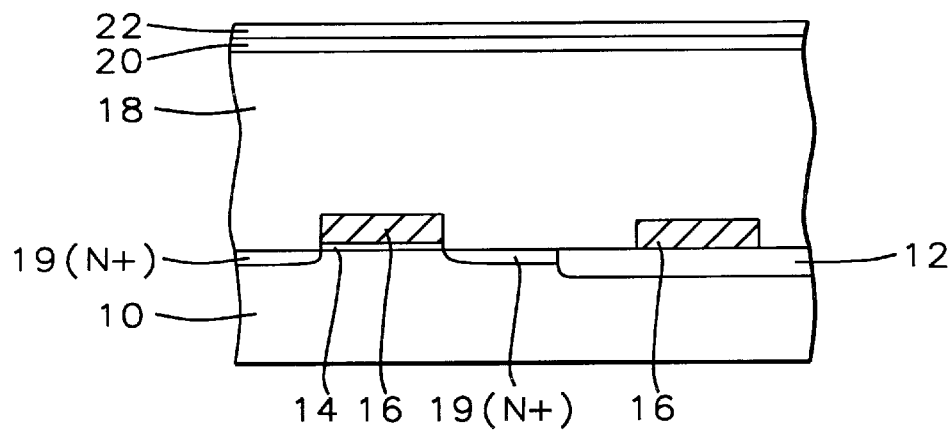
FIGS. 1 through 10 are schematic cross-sectional views showing the sequence of process steps for making a DRAM cell, by the method of this invention, which uses a single photoresist mask for making concurrently the capacitor bottom electrode and node contact.

Referring now to FIG. 1, a cross-sectional view is shown of a portion of a substrate 10 having a partially completed DRAM cell. The preferred substrate is composed of a P-type single-crystal silicon with a <100> crystallographic orientation. The details for the semiconductor devices in and on the substrate are briefly described to better appreciate the invention. The memory cells on a substrate for DRAM circuits typically have device areas surrounded and electrically isolated by field oxide (FOX) regions 12 and semiconductor devices such as field effect transistors (FETs) in the device areas. The field oxide 12 can be formed by the local oxidation of silicon (LOCOS) method, as commonly practiced in the industry, but for the purpose of this invention, a shallow trench isolation (STI) is depicted. This STI improves the cell density and provides a more planar surface for high-density circuits. Briefly, the STI involves etching a shallow trench and forming a chemical vapor deposited (CVD) silicon oxide ($SiO_2$) by various methods to make the STI planar with the substrate surface. The FETs are formed next. A gate oxide 14 is formed on the device areas, and a polycide (polysilicon and silicide) layer 16 is deposited and patterned to form the FET gate electrodes 16, while serving as word lines over the STI 12. Although not depicted in the drawings, the FETs can include lightly doped source/drain regions to improve circuit performance. After the gate electrodes 16 are formed, source/drain contact regions 19($N^+$) are formed adjacent to the gate electrodes by ion implantation.

Continuing, and more specific to the invention, a storage capacitor is formed over each of the memory cell areas to one of the device contact areas using a polysilicon plug as the node contact. Only one of the array of capacitors is depicted in the drawings. A first insulating layer 18 is deposited on the substrate to insulate the FETs on the substrate 10. Layer 18 is preferably $SiO_2$, and is deposited using low pressure CVD and a reactant gas such as tetraethosiloxane (TEOS). Alternatively, layer 18 can be a borophosphosilicate glass (BPSG) deposited by LPCVD using TEOS, and is doped with boron and phosphorus during the silicon oxide deposition. The first insulating layer 18 is then planarized. For example, layer 18 can be planarized using chemical/mechanical polishing (CMP) to provide global planarization. Alternatively, if a BPSG is used, the layer can be leveled by thermal annealing. The thickness of layer 18 after planarizing is preferably between about 5000 and 50000 Angstroms over the underlying FETs on the substrate 10. Next a silicon nitride ($Si_3N_4$) layer 20 is deposited to provide a hard mask. Preferably layer 20 is deposited by CVD using, for example, dichlorosilane ($SiCl_2H_2$) and ammonia ($NH_3$), and is deposited to a thickness of between about 1000 and 10000 Angstroms. A second insulating layer 22 is deposited on the $Si_3N_4$ layer 20. Layer 22 is $SiO_2$ deposited by CVD using, for example, tetraethosiloxane (TEOS) to a preferred thickness of between about 200 and 3000 Angstroms.

Figure 2:
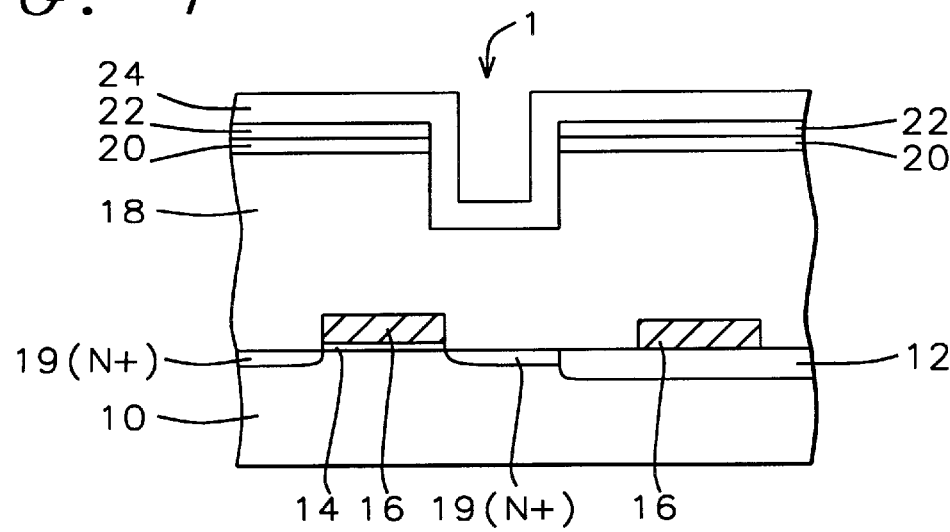

Referring to FIG. 2, first openings 1 are etched in the second insulating layer 22, the $Si_3N_4$ layer 20, and partially into the first insulating layer 18 over the device areas (memory cell areas) aligned over the source/drain contact areas 19($N^+$) on the substrate in which the capacitor bottom electrodes will be formed. Conventional photolithographic techniques and anisotropic plasma etching are used to etch the first openings 1. Preferably the etching is carried out in a high-density plasma (HDP) etcher using an appropriate fluorine-containing etchant gas using a timed etch.

Referring to FIG. 2, a conformal second $Si_3N_4$ layer 24 is deposited. Layer 24 is deposited by LPCVD using, for example, $SiCl_2H_2$ and $NH_3$ as the reactant gas, and is deposited to a preferred thickness of between about 2000 and 10000 Angstroms.

Figure 3:
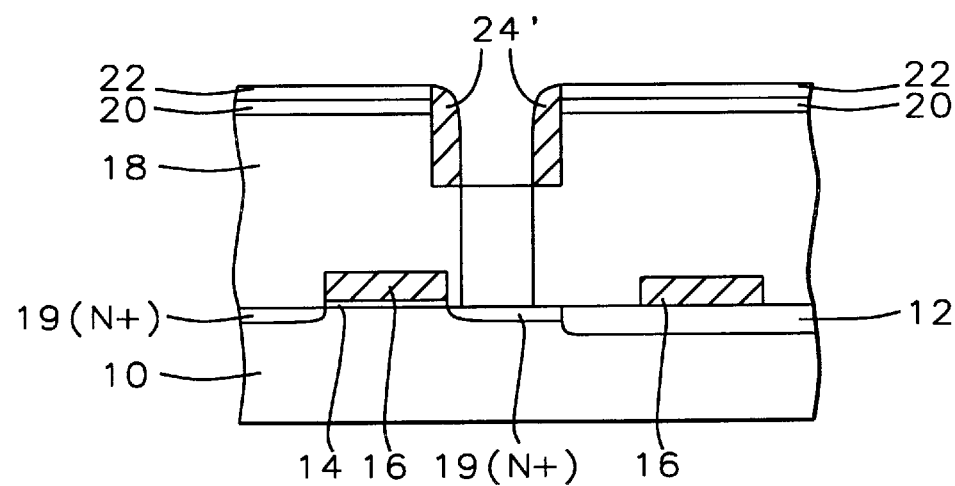

Referring to FIG. 3, the second $Si_3N_4$ layer 24 is then anisotropically plasma etched back to the second insulating layer 22, which serves as an etch-endpoint-detect layer, to form first sidewall spacers 24' on the sidewalls of the first openings 1.

Figure 4:
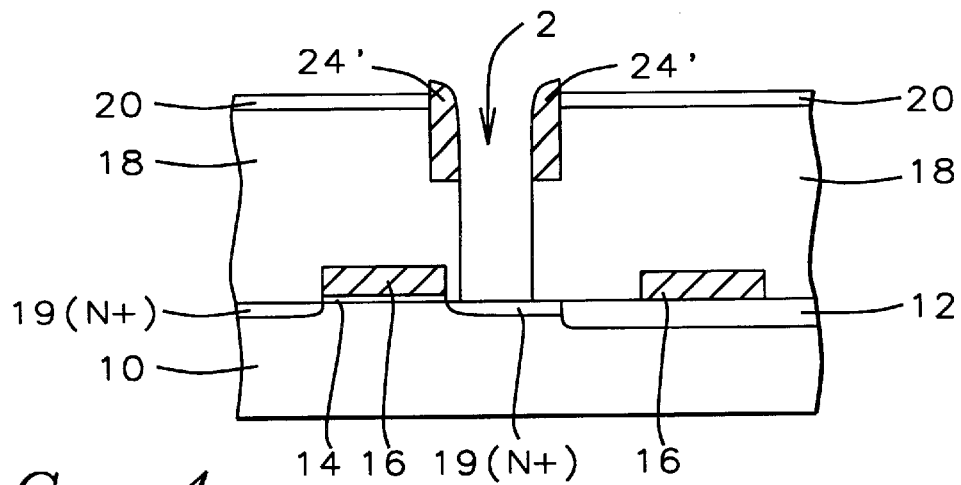

Referring to FIG. 4, second openings 2 are etched in the first insulating layer 18 exposed in the first openings 1, using the sidewall spacers 24' and the first $Si_3N_4$ layer 22 as a hard mask for etching. The second openings 2 are self-aligned to the sidewall spacers 24' and are etched to the source/drain contact areas 19($N_+$). Since the node contact openings 2 are reduced in size by the sidewall spacers 24', the second openings can be made having diameters that exceed the photoresist resolution (minimum feature size), and therefore can increase the memory cell density. Preferably the $SiO_2$ is etched selectively to the $Si_3N_4$ hard mask and the silicon substrate 10 using HDP etching and an appropriate etchant gas mixture that contains fluorine.

Figure 5:
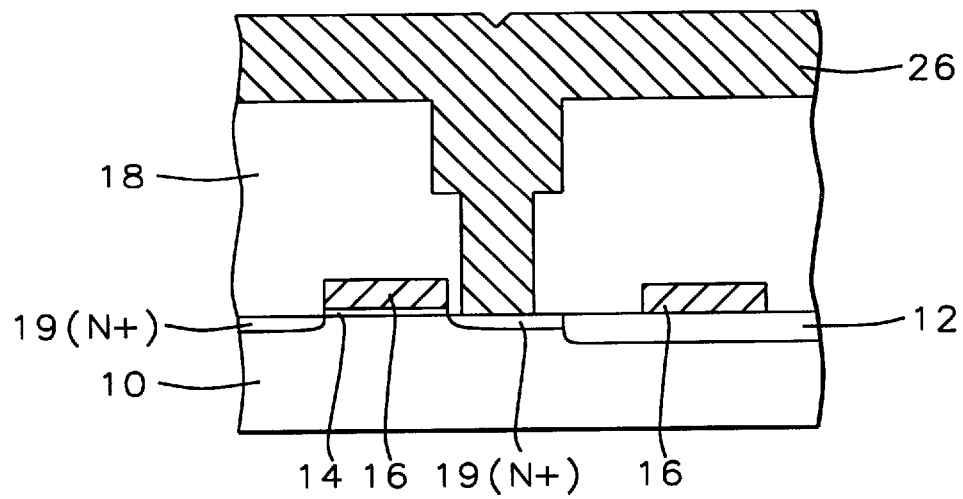

Referring to FIG. 5, the first $Si_3N_4$ layer 22 and the first $Si_3N_4$ sidewall spacers 24' are removed by selectively etching in a hot phosphoric acid ($H_3PO_4$) etch at a temperature of about 150 to 180° C. An $N^+$ doped first polysilicon layer 26 is deposited sufficiently thick to fill the first openings 1 and the second openings 2, resulting in an essentially planar surface. The polysilicon layer 26 is deposited by LPCVD using silane ($SiH_4$) as the reactant gas, and is in-situ doped with an N type dopant during deposition by adding a dopant gas such as phosphine ($PH_3$). Layer 26 is doped to a preferred concentration of between about 1.0 E 19 and 5.0 E 21 atoms/cm Referring to FIG. 6, the first polysilicon layer 26 is then etched back to form polysilicon plugs 26 in the first openings 1 and second openings 2. The polysilicon is etched back selectively to recess the polysilicon plugs 26 in the second openings 2. Preferably the plugs 26 are recessed to a depth of between about 300 and 4000 Angstroms. For example, the etchback can be carried out using a plasma etcher and an etchant gas or gas mixture that contains chlorine, which etches the polysilicon selectively to the $SiO_2$.

Figure 6:
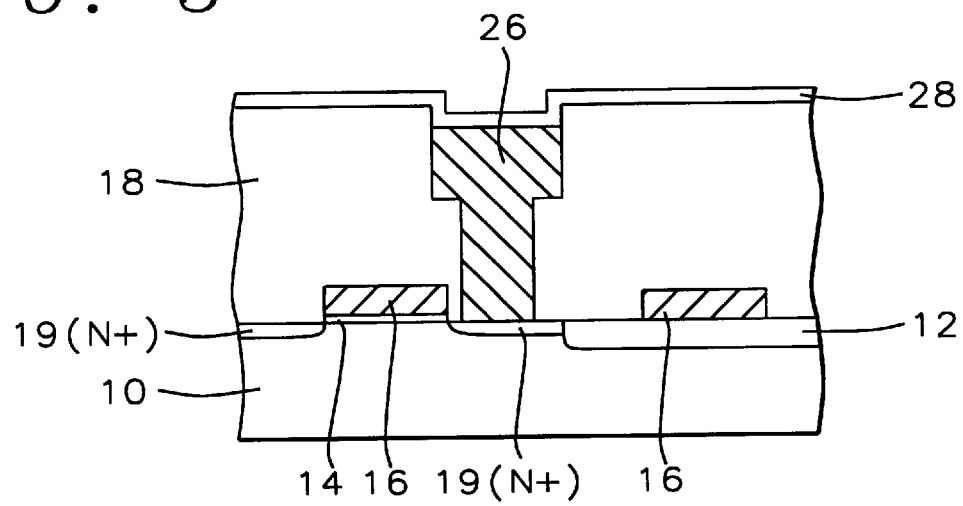

Still referring to FIG. 6, a relatively thin conformal third $Si_3N_4$ layer 28 is deposited. Preferably layer 28 is deposited by LPCVD using SiCl2H2 and $NH_3$ and is deposited to a thickness of between about 400 and 4000 Angstroms.

Figure 7:
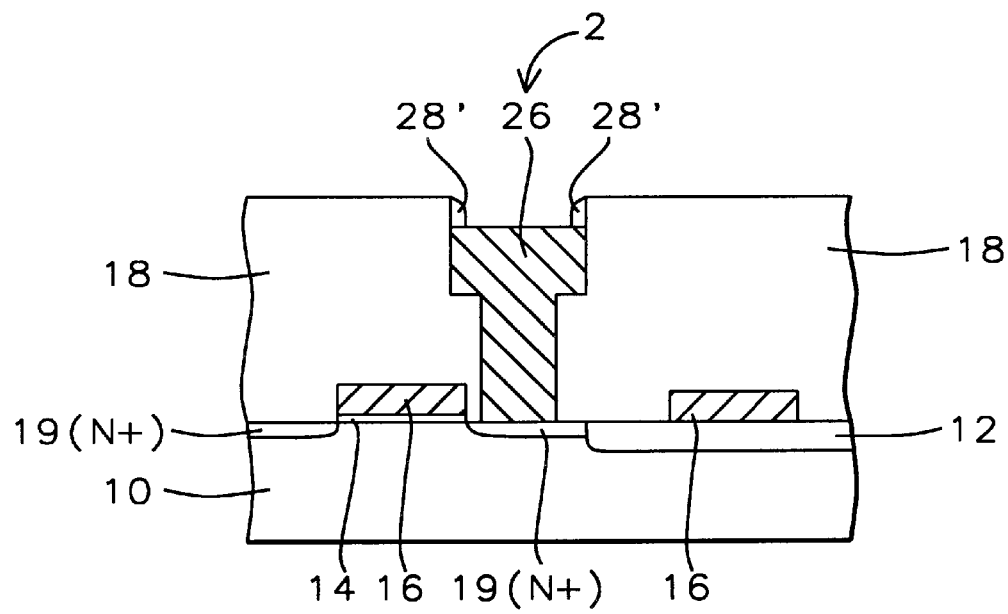

As shown in FIG. 7, the third $Si_3N_4$ layer 28 is anisotropically etched back to form second $Si_3N_4$ sidewall spacers 28' in the second openings 2 over the recessed polysilicon plugs 26. The etchback is carried out using plasma etching similar to the formation of the first $Si_3N_4$ sidewall spacers 24'.

Figure 8:
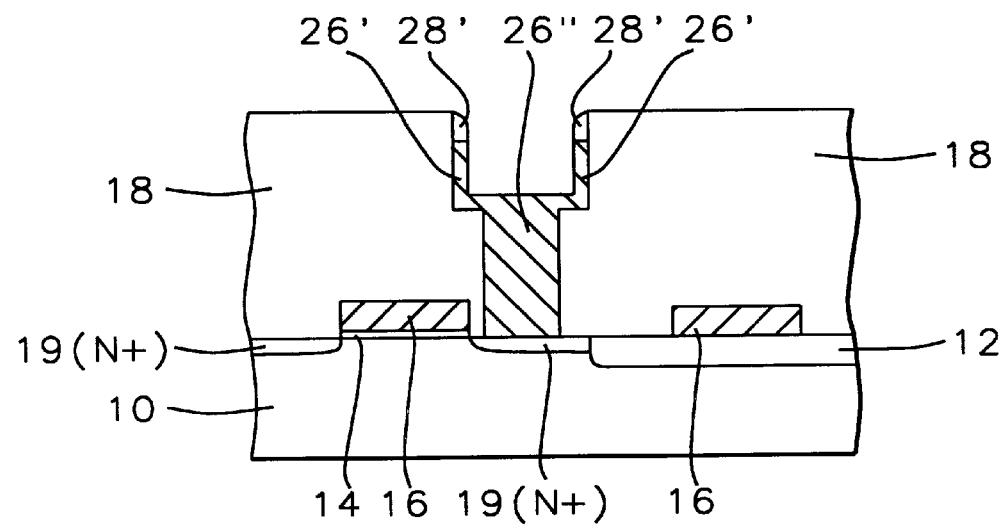

Now as shown in FIG. 8, the exposed polysilicon plugs 26 in the second openings 2 are recessed using the second $Si_3N_4$ sidewall spacers 28' as a hard mask to form the capacitor bottom electrodes having cylinder-shaped vertical sidewalls 26' self-aligned to the node contacts 26". The recessing is preferably carried out using anisotropic plasma etching in a plasma etcher using an etchant gas or gas mixture that contains chlorine.

Figure 9:
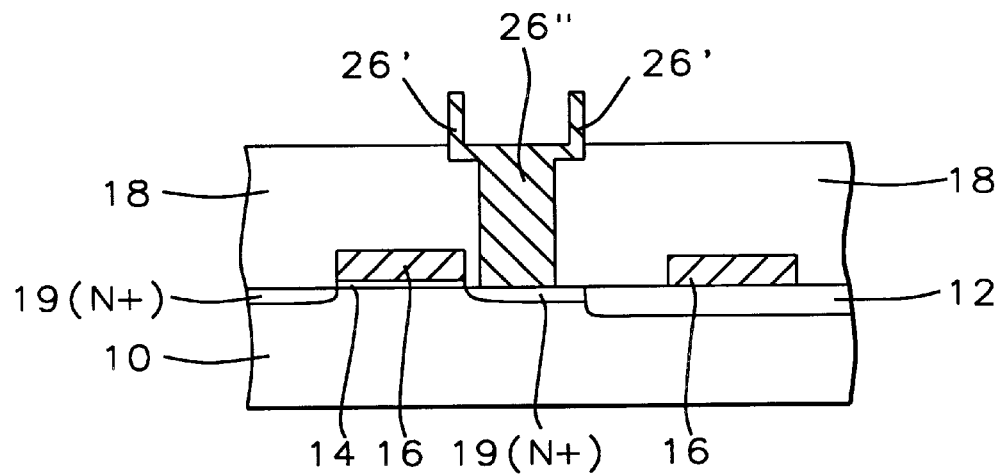

Referring to FIG. 9, the second $Si_3N_4$ sidewall spacers 28' are removed by using a hot $H_3PO_4$ acid etch. The first insulating layer 18 is then partially etched back to expose the cylinder-shaped vertical sidewalls 26' of the bottom electrodes. The $SiO_2$ layer 18 is preferably etched back using isotropic etching, for example, using wet etching in a hydrofluoric acid solution or by vapor etching using hydrogen fluoride (HF).

Figure 10:
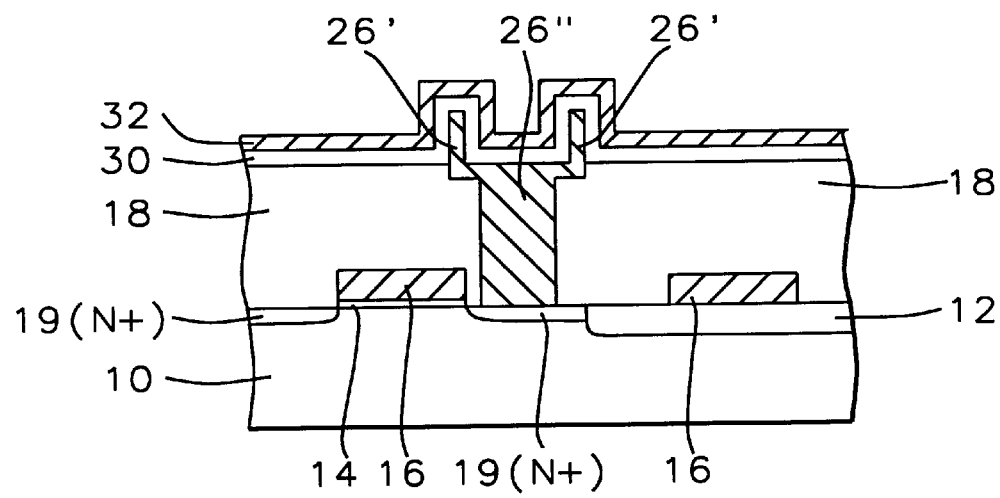

As shown in FIG. 10, the cylindrical capacitors are now completed by depositing an interelectrode dielectric layer 30 on the bottom electrodes 26', and forming the capacitor top electrodes by depositing and patterning a second polysilicon layer 32. The interelectrode dielectric layer 30 is formed on the surface of the bottom electrodes. The dielectric layer 30 is preferably between about 30 and 300 Angstroms thick, and is composed of a material having a high dielectric constant that is compatible with the polysilicon processing, and is continuous and pin-hole free. The preferred interelectrode dielectric layer is composed of silicon oxide-silicon nitride (ON) or a silicon oxide-silicon nitride-silicon oxide (ONO) layer. For example, the surface of the polysilicon bottom electrode 26' can be thermally oxidized to form the $SiO_2$, and then a thin conformal $Si_3N_4$ layer can be deposited using LPCVD to form the ON layer. To form the ONO layer, the exposed surface of the $Si_3N_4$ layer can then be reduced in an oxidizing ambient at elevated temperatures. Additionally, the surface of the polysilicon bottom electrodes 26' can be roughened to further increase the surface area and the capacitance. Other high-dielectric constant insulators can also be used, such as tantalum pentoxide ($Ta_2O_5$) and the like.

Still referring to FIG. 10, the second polysilicon layer 32 is deposited over the interelectrode dielectric layer 30, and is then patterned using conventional photolithographic and plasma etching techniques to form the top electrodes 32. The second polysilicon layer 32 is preferably deposited by LPCVD to a thickness of between about 500 and 5000 Angstroms, and is in-situ doped with an N-type dopant, such as phosphorous (P), having a preferred concentration in the range of between about 1.0 E 19 and 1.0 E 21 atoms/$cm^3$.

While the invention has been particularly shown and described with reference to the preferred embodiment thereof, it will be understood by those skilled in the art that various changes in form and detail may be made without departing from the spirit and scope of the invention.

What is claimed is:

1. A method for fabricating stacked capacitors for memory devices comprising the steps of:

providing a semiconductor substrate having device areas with semiconductor devices and contact areas for capacitor node contacts;

forming a planar first insulating layer over said device areas on said substrate;

depositing a first silicon nitride layer on said planar first insulating layer;

depositing a second insulating layer on said first silicon nitride layer;

etching first openings for capacitors in said second insulating layer, said first silicon nitride layer, and partially into said first insulating layer aligned over said contact areas for node contacts;

depositing a conformal second silicon nitride layer and anisotropically etching back to said second insulating layer to form first silicon nitride sidewall spacers in said first openings;

etching second openings for said node contacts in said first insulating layer to said contact areas in said first openings aligned to said first silicon nitride sidewall spacers;

removing said first silicon nitride layer and said first silicon nitride sidewall spacers;

depositing a first polysilicon layer sufficiently thick to fill said first and said second openings;

etching back said first polysilicon layer to form polysilicon plugs in said first and said second openings and recessing said polysilicon plugs in said second openings by overetching;

depositing a conformal third silicon nitride layer and anisotropically etching back to form second silicon nitride sidewall spacers in said second openings;

recessing said first polysilicon layer exposed in said second openings by anisotropic etching to form the sidewalls for bottom electrodes of said stacked capacitors;

removing said second silicon nitride sidewall spacers and etching back said first insulating layer to form freestanding said bottom electrodes aligned over said node contacts;

depositing an interelectrode dielectric layer on said bottom electrodes;

depositing and patterning a second polysilicon layer to form top electrodes and completing said stacked capacitors.

2. The method of claim 1, wherein said first insulating layer is silicon oxide, and has a thickness of between about 5000 and 50000 Angstroms after planarizing.

3. The method of claim 1, wherein said first silicon nitride layer is deposited to a thickness of between about 1000 and 10000 Angstroms.

4. The method of claim 1, wherein said second insulating layer is silicon oxide, and is deposited to a thickness of between about 200 and 3000 Angstroms.

5. The method of claim 1, wherein said first openings are etched to a depth of between about 4000 and 45000 Angstroms in said first insulating layer.

6. The method of claim 1, wherein said second silicon nitride layer is deposited to a thickness of between about 2000 and 10000 Angstroms.

7. The method of claim 1, wherein said first polysilicon layer is doped with conductive impurities to a concentration of between about 1.0 E 17 and 1.0 E 21 atoms/$cm^3$.

8. The method of claim 1, wherein said third silicon nitride layer is deposited to a thickness of between about 400 and 4000 Angstroms.

9. The method of claim 1, wherein said interelectrode dielectric layer is silicon oxide/silicon nitride/ silicon oxide (ONO), and has a thickness of between about 30 and 300 Angstroms.

10. The method of claim 1, wherein said second polysilicon layer is doped with conductive impurities to a concentration of between about 1.0 E 19 and 1.0 E 21 atoms/cm$^3$, and is deposited to a thickness of between about 500 and 5000 Angstroms.

11. A method for fabricating dynamic random access memory (DRAM) devices having stacked capacitors comprising the steps of:

provic a semiconductor substrate having device areas for memory cells having a field effect transistor (FET) in each of said memory cells and source/drain contact areas for capacitor node contacts;

forming a planar first insulating layer over said device areas on said substrate;

depositing a first silicon nitride layer on said planar first insulating layer;

depositing a second insulating layer on said first silicon nitride layer;

etching first openings for capacitors in said second insulating layer, said first silicon nitride layer, and partially into said first insulating layer aligned over said contact areas for node contacts;

depositing a conformal second silicon nitride layer and anisotropically etching back to said second insulating layer to form first silicon nitride sidewall spacers in said first openings;

etching second openings for said node contacts in said first insulating layer to said source/drain contact areas in said first openings aligned to said first silicon nitride sidewall spacers;

removing said first silicon nitride layer and said first silicon nitride sidewall spacers;

depositing a first polysilicon layer sufficiently thick to fill said first and said second openings;

etching back said first polysilicon layer to form polysilicon plugs in said first and said second openings and recessing said polysilicon plugs in said second openings by overetching;

depositing a conformal third silicon nitride layer and anisotropically etching back to form second silicon nitride sidewall spacers in said second openings;

recessing said first polysilicon layer exposed in said second openings by anisotropic etching to form the sidewalls for bottom electrodes of said stacked capacitors;

removing said second silicon nitride sidewall spacers and etching back said first insulating layer to form freestanding said bottom electrodes aligned over said node contacts to said source/drain contact areas;

depositing an interelectrode dielectric layer on said bottom electrodes;

depositing and patterning a second polysilicon layer to form top electrodes and completing said stacked capacitors.

12. The method of claim 11, wherein said first insulating layer is silicon oxide, and has a thickness of between about 5000 and 50000 Angstroms after planarizing.

13. The method of claim 11, wherein said first silicon nitride layer is deposited to a thickness of between about 1000 and 10000 Angstroms.

14. The method of claim 11, wherein said second insulating layer is silicon oxide, and is deposited to a thickness of between about 200 and 3000 Angstroms.

15. The method of claim 11, wherein said first openings are etched to a depth of between about 4000 and 45000 Angstroms in said first insulating layer.

16. The method of claim 11, wherein said second silicon nitride layer is deposited to a thickness of between about 2000 and 10000 Angstroms.

17. The method of claim 11, wherein said first polysilicon layer is doped with conductive impurities to a concentration of between about 1.0 E 17 and 1.0 E 21 atoms/cm$^3$.

18. The method of claim 11, wherein said third silicon nitride layer is deposited to a thickness of between about 400 and 4000 Angstroms.

19. The method of claim 11, wherein said interelectrode dielectric layer is silicon oxide/silicon nitride/silicon oxide (ONO), and has a thickness of between about 30 and 300 Angstroms.

20. The method of claim 11, wherein said second polysilicon layer is doped with conductive impurities to a concentration of between about 1.0 E 19 and 1.0 E 21 atoms/cm$^3$, and is deposited to a thickness of between about 500 and 5000 Angstroms.

* * * * *